United States Patent
Shamanna et al.

(10) Patent No.: US 12,367,926 B2
(45) Date of Patent: Jul. 22, 2025

(54) APPARATUS AND METHOD TO OPTIMIZE SENSE-AMP ENABLE PULSE-WIDTH IN SRAM ARRAYS

(71) Applicant: Intel Corporation, Santa Clara, CA (US)

(72) Inventors: Gururaj K. Shamanna, Austin, TX (US); Naveen Kumar M., Bangalore (IN); Jagadeesh Chandra Salaka, Bangalore (IN); Pascal A. Meinerzhagen, Hillsboro, OR (US); Sravan K. Puchakayala, Folsom, CA (US); Iqbal Rajwani, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 765 days.

(21) Appl. No.: 17/504,252

(22) Filed: Oct. 18, 2021

(65) Prior Publication Data

US 2023/0123514 A1    Apr. 20, 2023

(51) Int. Cl.
| | |
|---|---|
| *G11C 16/04* | (2006.01) |
| *G11C 11/412* | (2006.01) |
| *G11C 11/419* | (2006.01) |
| *H03K 3/037* | (2006.01) |
| *H03K 19/20* | (2006.01) |

(52) U.S. Cl.
CPC .......... *G11C 11/419* (2013.01); *G11C 11/412* (2013.01); *H03K 3/037* (2013.01); *H03K 19/20* (2013.01)

(58) Field of Classification Search
CPC ............................. G11C 11/419; G11C 11/412
See application file for complete search history.

(56) References Cited

U.S. PATENT DOCUMENTS

| | | | | |
|---|---|---|---|---|
| 5,570,317 | A * | 10/1996 | Rosen .............. | G11C 29/50016 |
| | | | | 365/203 |
| 9,640,256 | B1 * | 5/2017 | Roy ........................ | H10B 10/12 |
| 11,676,681 | B2 * | 6/2023 | Tanaka ................... | G11C 5/063 |
| | | | | 365/201 |

OTHER PUBLICATIONS

Bharadwaj et al., "A Replica Technique for Wordline and Sense Control in Low-Power SRAM's", IEEE Journal of Solid-State Circuits, vol. 33, No. 8, Aug. 1998, pp. 1208-1219.

* cited by examiner

*Primary Examiner* — Pho M Luu
(74) *Attorney, Agent, or Firm* — NICHOLSON DE VOS WEBSTER & ELLIOTT LLP

(57) ABSTRACT

Circuits for optimizing the duration of a sense amp enable signal in a memory device such as SRAM.

21 Claims, 12 Drawing Sheets

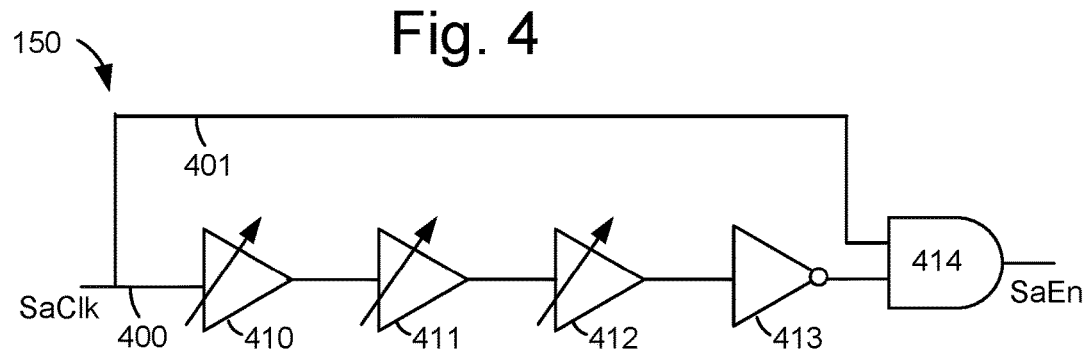
Fig. 4
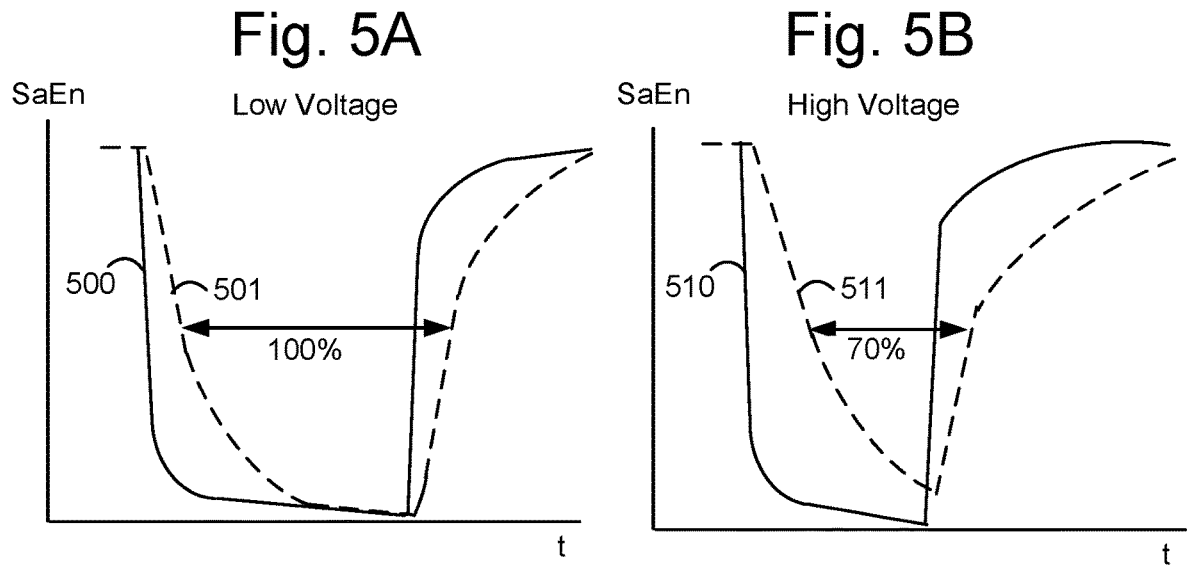
Fig. 5A
Fig. 5B
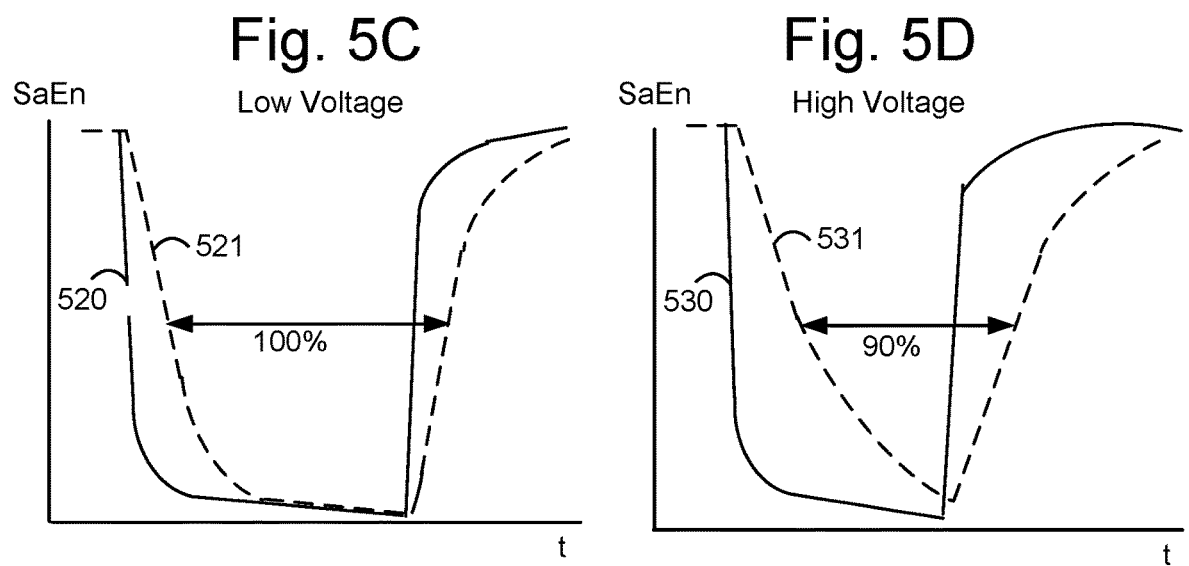
Fig. 5C
Fig. 5D

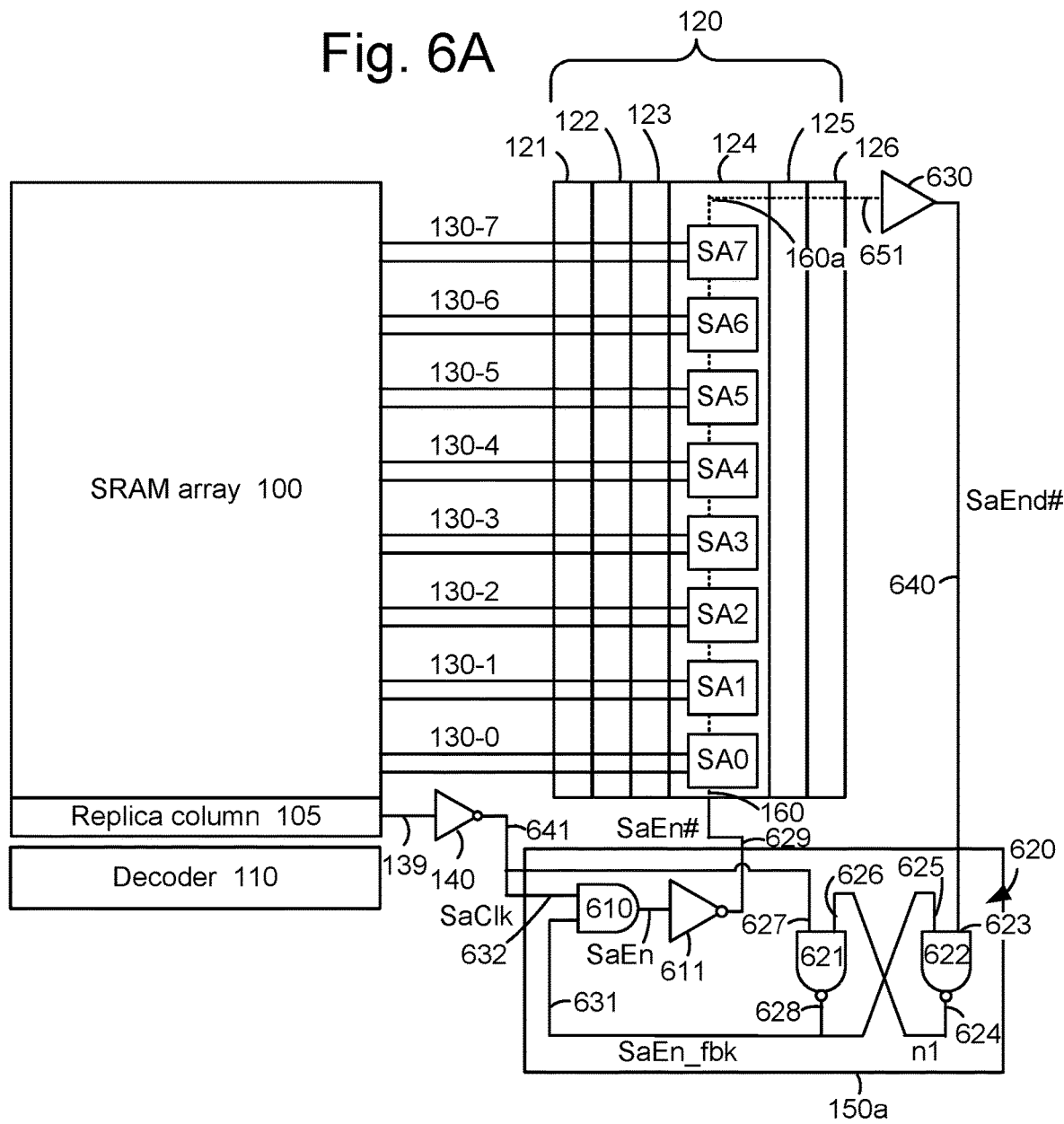

Fig. 6B

Idle state:
SaClk/node 627=0
SaEn=0
SaEn#=1
SaEnd#/node 623=1
Node 624/626=0
Node 625/628/631/SaEn_fbk=1

Fig. 6C

SaEn# asserted, before feedback signal changes at control circuit:
SaClk/node 627=1
SaEn=1
SaEn#=0
SaEnd#/node 623=1
Node 624/626=0
Node 625/628/631/SaEn_fbk=1

Fig. 6D

SaEn# still asserted, when feedback signal first changes at control circuit:
SaClk/node 627=1
SaEn=1
SaEn#=0
SaEnd#/node 623=0
Node 624/626=1
Node 625/628/631/SaEn_fbk=0

Fig. 6E

SaEn# de-asserted by change in feedback signal:
SaClk/node 627=1
SaEn=0
SaEn#=1
SaEnd#/node 623=0
Node 624/626=1
Node 625/628/631/SaEn_fbk=0

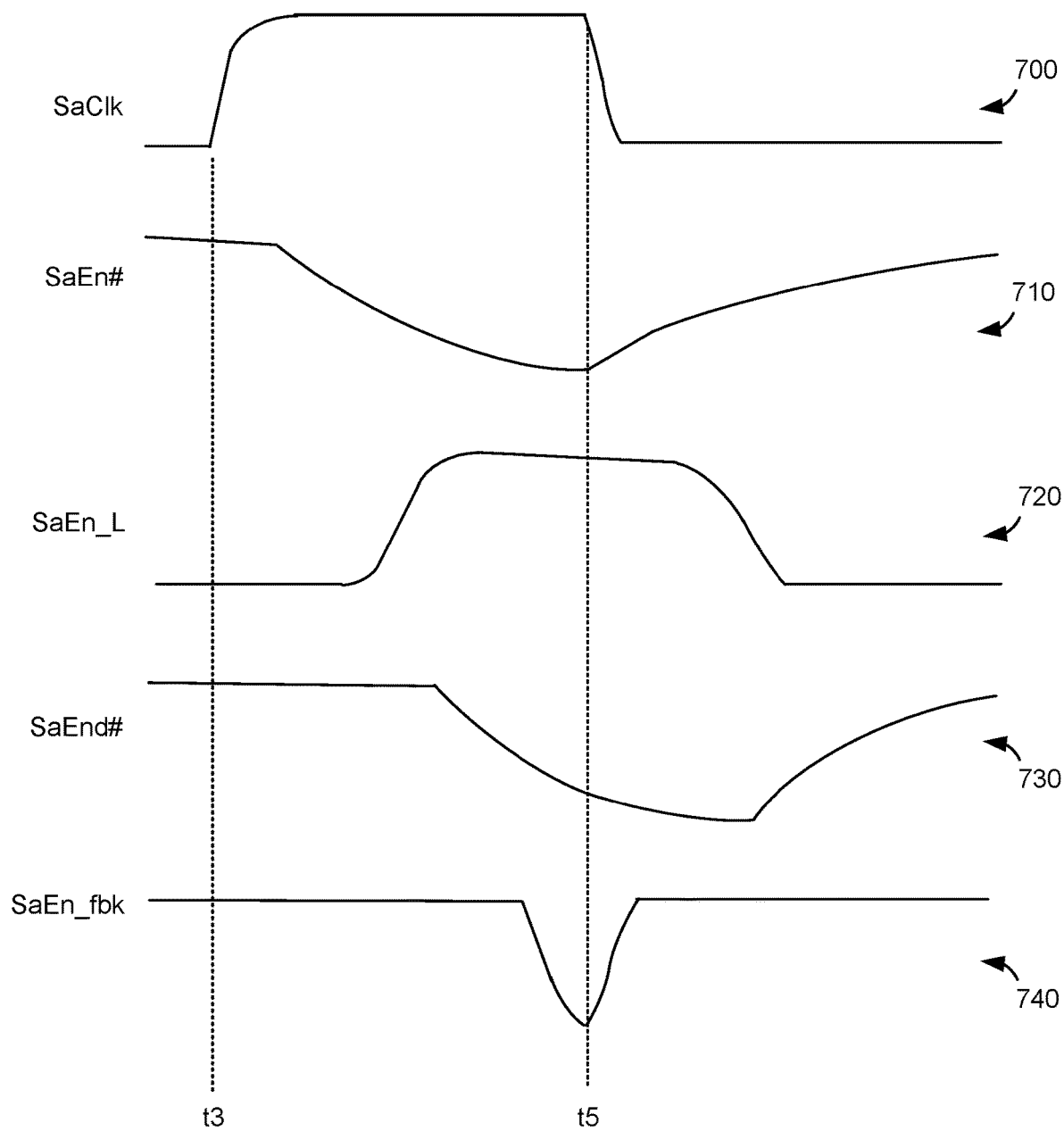

APPARATUS AND METHOD TO OPTIMIZE SENSE-AMP ENABLE PULSE-WIDTH IN SRAM ARRAYS

FIELD

The present application generally relates to the field of memory devices and, more specifically, to the operation of sense amplifiers in such memory devices.

BACKGROUND

Memory devices include both volatile and non-volatile memory. One example of volatile memory is Static Random Access Memory (SRAM). SRAM can be used, e.g., to provide a cache memory for a Central Processing Unit (CPU) since it provides fast access speed and low power consumption. In an SRAM device, the memory cells are arranged in rows and columns, where each row is associated with a word line and each column is associated with a pair of bit lines. In a read operation, a row of cells is selected. For each selected cell, the associated pair of bit lines is pre-charged and the cell communicates with the bit lines so that voltages develop on the bit lines based on the data stored in the cell. An associated sense amplifier (sense amp) is then enabled to detect the bit line voltages and output a corresponding bit of data. However, various challenges are presented in optimizing the read operation.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4 depicts an example implementation of the control circuit 150 of FIG. 1 for generating SaEn, the sense amp enable signal of FIG. 1, where the control circuit comprises a chopper circuit to control the pulse width of SaEn.

FIG. 5A depicts the sense amp enable signal of FIG. 1 as generated by a chopper circuit with 20 stages, where the signal has a low voltage, and where the signal is close to (plot 500) or far from (plot 501) the control circuit 150.

FIG. 5B depicts the sense amp enable signal of FIG. 1 as generated by a chopper circuit with 20 stages, where the signal has a high voltage, and where the signal is close to (plot 510) or far from (plot 511) the control circuit 150.

FIG. 5C depicts the sense amp enable signal of FIG. 1 as generated by a chopper circuit with 25 stages, where the signal has a low voltage, and where the signal is close to (plot 520) or far from (plot 521) the control circuit 150.

FIG. 5D depicts the sense amp enable signal of FIG. 1 as generated by a chopper circuit with 25 stages, where the signal has a high voltage, and where the signal is close to (plot 530) or far from (plot 531) the control circuit 150.

FIG. 6A depicts an example implementation of the SRAM device of FIG. 1, where the control circuit 150a comprises a set-reset latch 620 for de-asserting a sense amp enable signal in response to a feedback signal from the set of sense amplifiers, and the feedback signal is taken from a point which is after the farthest sense amp from the control circuit in accordance with various embodiments.

FIG. 6B depicts a table of signal values consistent with FIG. 6A at the time the device is in an idle state.

FIG. 6C depicts a table of signal values following FIG. 6B, at the time SaEn# is asserted and before the feedback signal changes at the control circuit.

FIG. 6D depicts a table of signal values following FIG. 6C, when SaEn# is still asserted and the feedback signal first changes at the control circuit.

FIG. 6E depicts a table of signal values following FIG. 6D, when SaEn# is de-asserted by the change in the feedback signal at the control circuit.

FIG. 7 depicts example waveforms consistent with FIG. 6A including SaClk, SaEn#, SaEn_L, SaEnd# and SaEnd_fbk.

DETAILED DESCRIPTION

Figure 1:
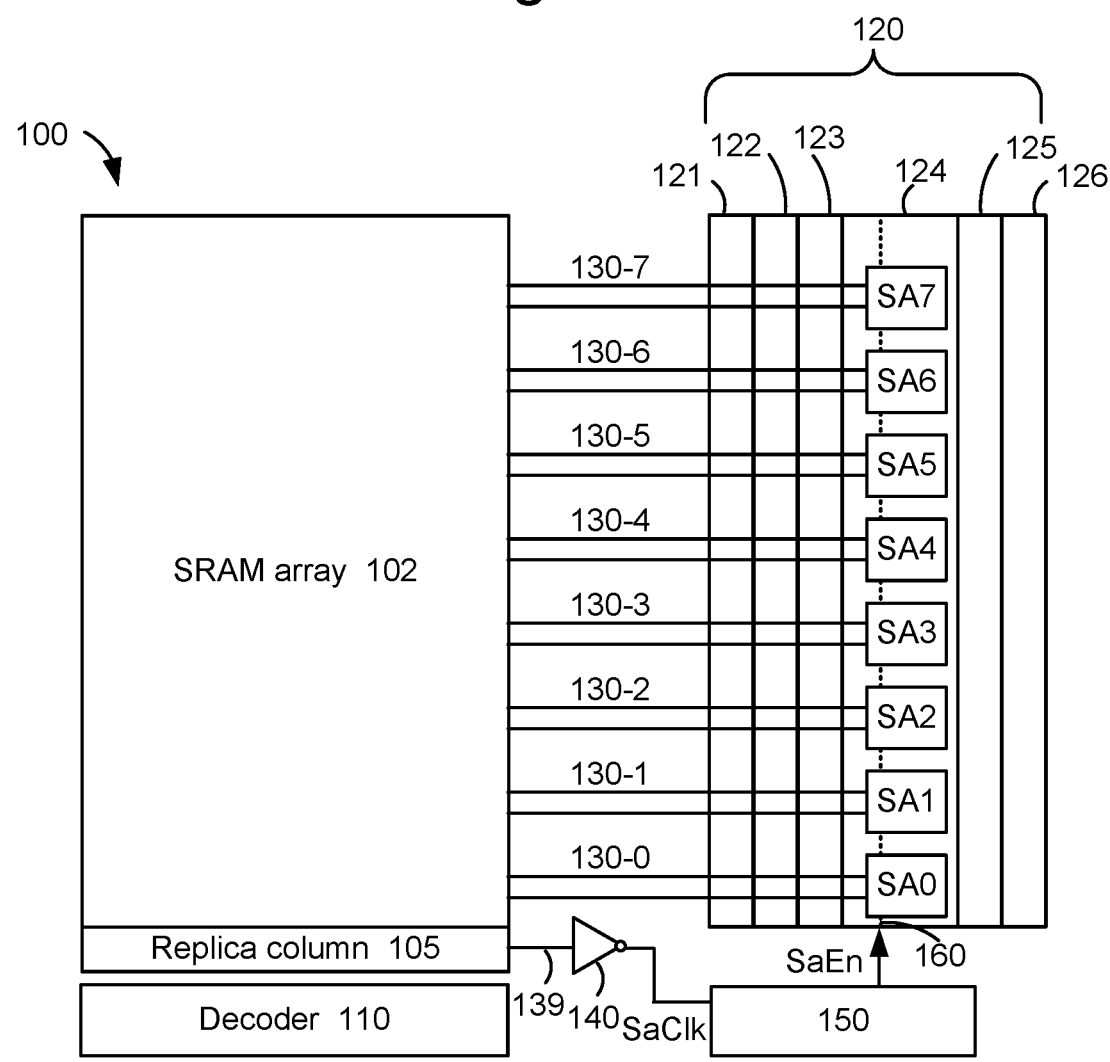
FIG. 1 illustrates an example SRAM device in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

As mentioned at the outset, various challenges are presented in optimizing a read operation for a memory device such as SRAM. During a read operation, for each selected cell, an associated pair of bit lines is pre-charged and the cell is allowed to communicate with the bit lines so that voltages develop on the bit lines based on the data stored in the cell. A sense amp enable signal is generated which allows an associated sense amp to sense the data state of the memory cell. The sense amp can sense a voltage differential in the pair of bit lines and output a corresponding bit of data.

However, the time period in which the sense amps are enabled should be carefully set. For example, if the time period is too short, some of the sense amps may not be able to complete their sensing operation. This is particularly true for sense amps which are relatively far from the circuit which generates the sense amp enable signal. Due to a propagation delay, the enable signal which is received by the farther sense amps can be distorted by triangulation. See FIG. 5A-5D. Moreover, if the time period is too long, the performance of the memory device is compromised as the read time is unnecessarily long.

While the time period can be optimized by testing for a group of memory devices, this does not account for variations among different memory devices, e.g., due to variations in the fabrication process, or variations in the voltage levels. Additionally, changes in temperature for a given memory device can affect the optimum time period of the sense amp enable signal.

The techniques provided herein address the above and other issues by providing a feedback path to a control circuit which generates the sense amp enable signal. A change in a voltage of the feedback path indicates the sense amp enable signal should be de-asserted. The assertion time is therefore optimized even when there are variations in process, temperature and voltage.

In one option, the feedback signal is a version of the sense amp enable signal and is taken from a point which is after the farthest sense amp from the control circuit. The feedback signal can therefore indicate that the sense amp enable signal has reached the farthest sense amp so that the sense amp enable signal can be de-asserted without impairing the operation of the sense amps.

In another option, the feedback signal is taken from a point which is between the closest and farthest sense amps. This reduces the assertion time but the time may still be sufficient since there is a delay in receiving and processing the feedback signal.

In another option, a multiplexer is used to select the feedback signal from a selected point among two or more points on the path of the sense amp enable signal based on one or more factors such as temperature and voltage.

In yet another option, logic gates are provided to indicate that a selected sense amp has completed the sensing of its respective cell, and the feedback signal changes based on this indication. This ensures that the sense amp enable signal remains asserted until the sense amps have completed reading their respective cells. The selected sense amp could be the farthest sense amp from the control circuit, for example.

In one possible approach, the control circuit comprises a set-reset latch which triggers the de-assertion of the sense amp enable signal based on the feedback signal.

In another possible approach, the control circuit comprises an inverting or D flip flop which triggers the de-assertion of the sense amp enable signal based on the feedback signal.

The above and other advantages are discussed further below.

FIG. 1 illustrates an example SRAM device in accordance with various embodiments. The SRAM device 100 includes memory cells in an SRAM array 102 and in a replica column 105. The memory cells are arranged in rows and columns, where each row is associated with a word line and each column is associated with a pair of bit lines. A decoder 110 performs function such as decoding a control signal to select a word line for a read or write operation. In this simplified example there are eight columns which extend horizontally in the figure. Pairs of bits lines 130-0 to 130-7 are associated with the columns. See FIG. 3 for further details.

A set of circuits 120 associated with the SRAM array includes a write column multiplexer (mux) 121, a read column mux 122, a bit line pre-charge circuit 123, a set of sense amplifiers 124 including example sense amps SA0-SA7, a read latch 125 and a write driver 126. The sense amps SA0-SA7 sense the data state of a selected memory cell using the bit line pairs 130-0 to 130-7, respectively.

Figure 3:
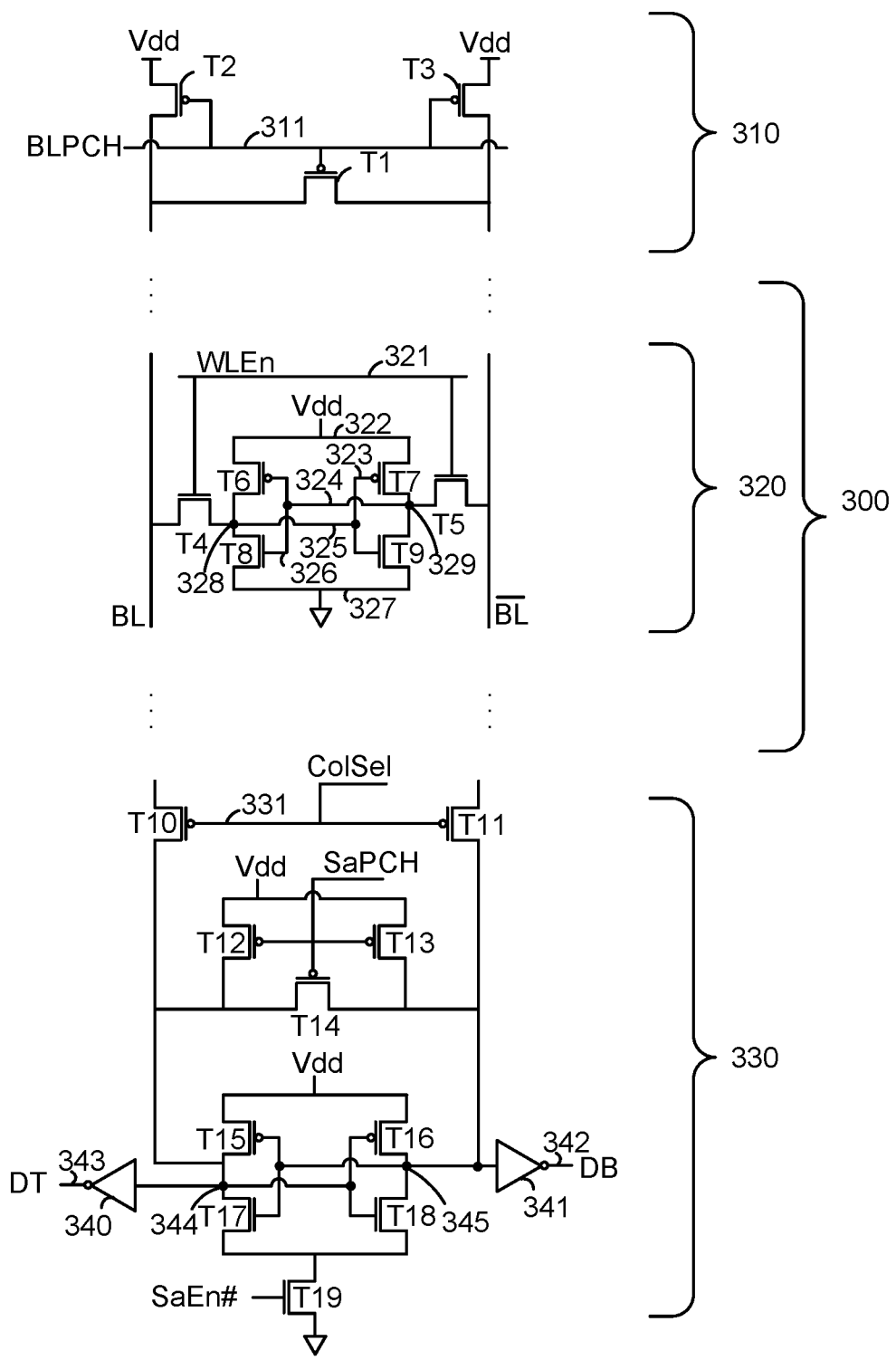
FIG. 3 depicts an example configuration of a bit line pre-charge circuit 310 and a memory cell 320 in the SRAM array, along with an associated sense amp 330, in accordance with various embodiments.

The bit line pre-charge circuit 123 can alternatively be at the opposing end of the columns of memory cells, such as depicted in FIG. 3.

A control circuit 150 is configured to provide a sense amp enable signal SaEn on a conductive path 160 which is connected to each of the sense amps. The control circuit is responsive to a clock signal SaClk which is received from the replica column via an inverter 140. The replica column contains replica memory cells that are essentially identical to the cells in the array. During a read, a replica word line signal is asserted, turning on a fixed number of replica cells, also referred to as driver cells, which discharge a replica bit line 139. The driver cells are hardwired to store "0" while the remaining replica cells act as dummy loads on the replica bit line. The full-swing signal on the replica bit line signal is then inverted and buffered at the inverter 140 to generate SaClk. See also FIG. 2.

Figure 2:
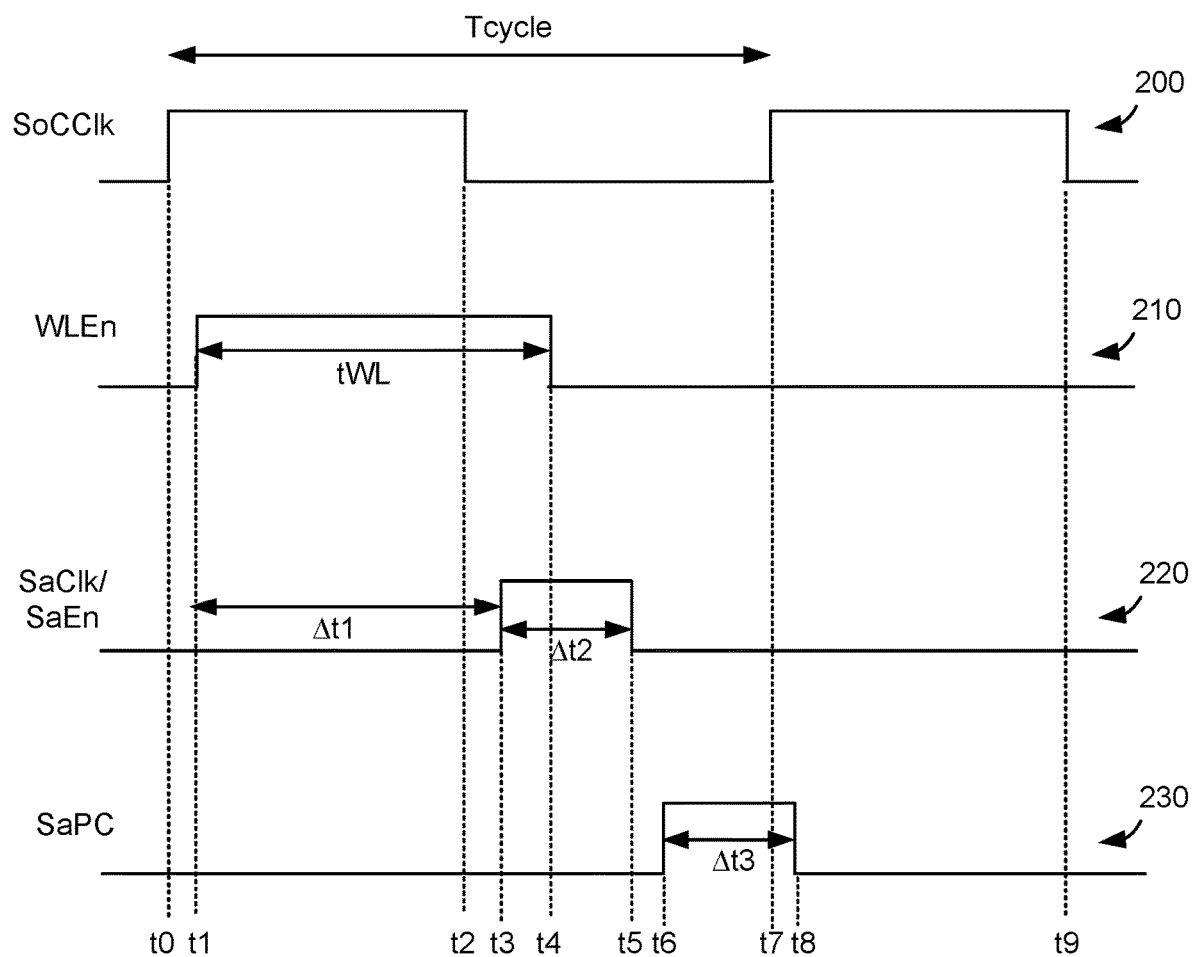
FIG. 2 illustrates example waveforms for use with the SRAM device of FIG. 1, including SoCClk, a system clock, WLEn, a word line enable signal, SaClk, a sense amp clock, SaEn, a sense amp enable signal, and SaPC, a sense amp pre-charge signal, in accordance with various embodiments.

FIG. 2 illustrates example waveforms for use with the SRAM device of FIG. 1, including SoCClk, a system clock, WLEn, a word line enable signal, SaClk, a sense amp clock, SaEn, a sense amp enable signal, and SaPC, a sense amp pre-charge signal, in accordance with various embodiments. Time points t0-t9 are also depicted.

SoCClk (plot 200) is a system clock such as for a system on a chip. Tcycle represents a cycle or period of the clock signal and extends from t0-t7. SoCClk is high from t0-t2 and t7-t9. The rise in SaClk at t0 triggers the assertion of WLEn at t1, after a delay t1-t0.

WLEn (plot 210) is a word line enable signal for the word lines in the SRAM array. WLEn is asserted at t1 (active high) for a selected word line in a read operation, in response to the increase in SoCClk. With WLEn is asserted, the memory cells connected to the word line communicate with the associated bit line pair such that voltages are developed on each bit line pair based on the data state of the respective memory cell. WLEn remains high for a specified time of tWL, from t1-t4.

SaClk/SaEn (plot 220) represents the clock signal from the replica column as well as the sense amp enable signal, in a comparative approach. SaClk is input to a control circuit which generates the sense amp enable signal. After a delay Δt, 1 which is based on a delay element such as the replica bit line circuit, SaClk/SaEn transition high at t3 and remain high from t3-t5, in a time period Δt2. The decrease in WLEn at t4 is in response to the increase in SaEn at t3 such that WLEn is de-asserted while SaClk/SaEn are still asserted.

SaPC (plot 230) is a sense amp pre-charge signal. When SaPC is asserted, e.g., high, the sense amps are pre-charged in preparation for a subsequent read operation. The increase in SaPC at t6 is in response to the decrease in SaEn at t5. SaPC remains asserted for a time period Δt3, until t8, which may extend until before or after the second rise of SoCClk. In this example, SaPC remains asserted until after the second rise of SoCClk at t7.

Tcycle is an important metric in a self-timed SRAM array since it determines the frequency of back-to-back memory operations that a SoC can support. A higher Tcycle translates to a lower SoC clock frequency, which is undesirable. Tcycle has an intricate dependency on the memory cell choice, design style and size of the SRAM array. Tcycle is usually determined by three parameters. First, the word line (WL) pulse width should be wide enough to ensure a sufficient bit line voltage differential is developed for the sense amplifier circuit to correctly sense the data stored in the memory cell. Second, the sense amp enable pulse width should be wide enough for the sense amp to correctly sense the bit line voltage differential and capture the corresponding data in a latch. Third, the sense amp pre-charge pulse width should be wide enough to pre-charge the sense amp nodes to logic "1" before the next read operation or rising edge of the word line.

The delay of the sense amp enable and the sense amp pre-charge signals is dominated by interconnect paths on which they are carried. These signals typically need to traverse the entire height of the SRAM array. For SRAM arrays supporting a large number of bits (memory cells), the sense amp enable pulse width is determined by the flight time, or propagation time, which the signal needs to reach the last or farthest sense amp instead of the time required for the sense amp to sense and latch the data correctly.

In the waveforms of FIG. 2, the sense amp enable pulse width is typically the same as, and dictated by, the SaClk pulse width. That is, the rising edge of SaEn is generated from the from replica bit line circuit and the falling edge of SaEn is generated from the falling edge of a self-timed clock. This approach reduces the sensitivity to voltage and temperature variations since the replica bit line is involved in generating both the rising and falling edge of SaEn. However, the SaEn pulse width in this approach will be wider than required, since the falling edge of the self-timed clock is usually tuned to optimize the pulse width of the word line signal.

In contrast, with the techniques described herein, the sense amp enable signal can be de-asserted before the end of the SaClk pulse so that the read time is reduced. The techniques described herein provide a self-resetting circuit topology which results in an optimal pulse width of a sense amp enable signal across the entire spectrum of process, operating voltage and temperature (PVT) conditions. As a result, the Tcycle of the SRAM array improves. Dynamic power consumed in a read operation is also reduced since the self-resetting circuit topology does not incorporate intentional delay elements.

FIG. 3 depicts an example configuration of a bit line pre-charge circuit 310 and a memory cell 320 in the SRAM array, along with an associated sense amp 330, in accordance with various embodiments. The memory cell is an example cell in a column of memory cells 300. The bit line pre-charge circuit is configured to charge up the bit line pair for the column, and the sense amp is configured to sense a voltage differential on the bit line pair to determine the data state of the cell.

The figures depict nMOSFETs and pMOSFETs (with a circle on the gate). A MOSFET refers to a metal oxide semiconductor field-effect transistor.

In a bit line pair, BL is a bit line and BL_overbar is a complementary bit line.

In the bit line pre-charge circuit 310, when a bit line pre-charge signal BLPCH is enabled (active low) on a control line 311, the transistors T1-T2 are provided in a conductive state. This provides a power supply voltage, Vdd, on the bit lines BL and BL_overbar, where the potential is equalized on the bit lines.

The example memory cell 320 has a six transistor (6T) configuration, with transistors tT4-T9. To read a value stored in the memory cell, the associated word line (WL) 321 is enabled with the signal WLEn (active high), after the bit lines have been pre-charged. The nodes 328 and 329 provide complementary bit values, where the bit value at node 328 is considered to be the value stored by the memory cell. The node 329 is connected to the path 326 by a path 324, and the node 328 is connected to the path 323 by a path 325.

The memory cell further includes pull-up pMOSFETs T6 and T7 and pull-down nMOSFETs T8 and T9. T6 and T8 have their gates connected by a path 326 which is coupled to the node 329, and T7 and T9 have their gates connected by a path 323 which is coupled to the node 328. Vdd is applied at a path 322. A path 327 is connected to ground.

An nMOSFET access transistor T4 is coupled to BL and to the node 328, while an nMOSFET access transistor T5 is similarly coupled to BL_overbar and to the node 329. A gate terminal of each of the access transistors T4 and T5 is coupled to the word line. Enabling the WL electrically connects BL to the node 328 and BL_overbar to the node 329.

As an example, assume a bit value at the node 328 is "1" (Vdd) and a bit value at the node 329 is "0" (0 V). Consequently, T6 is turned on and T8 is turned off by the voltage at the node 329, thereby holding the voltage at the node 328 to Vdd. Similarly, the voltage at the node 328 turns off T7 and turns on T9, thereby coupling node 329 to ground.

A turn on state refers to a conductive state and a turn off state refer to a non-conductive state.

At the beginning of a read operation, BL and BL_overbar are pre-charged to the supply voltage by enabling the BLPCH signal. BLPCH is subsequently disabled and the word line signal is enabled to electrically connect BL to the node 328 and BL_overbar to the node 329. Since both BL and the node 328 were charged to the supply voltage prior to enabling the word line signal, the voltage on BL remains substantially unchanged. However, the voltage on BL_overbar will dip due to its direct path through T5 and T9 to ground. The sense amplifier 330 coupled to the bit line pair senses the resulting difference between the voltages on the bit lines to determine that memory cell stores a bit value of "1".

The sense amp comprises cross-coupled inverters that convert the bit-line voltage difference at their input to a full swing output. The inverters are formed by T15 and T17 and by T16 and T18. The transistor T19 is a grounding transistor which is used to enable the sense amplifier in response to the sense amp enable signal SaEn# (active high).

The internal nodes 344 and 345 are isolated from an external load by output inverters 340 and 341, respectively. In the pre-charge phase, SaPCH is kept active low so that bit lines and the nodes 344 and 345 are pre-charged high. During an evaluation phase, the sense amplifier is connected to the memory cell by pulling down a column select signal (ColSel) on a path 331 to provide transistors T10 and T11 in a conductive state. A voltage difference is developed between the bit lines as a function of the stored data in the memory cell. If the data stored in the memory cell is a "1," the voltage across BL_overbar decreases slightly. If the stored data in the memory cell is a "0," the voltage across BL decreases slightly. Once the differential voltage has been developed beyond a threshold between the bit lines, SaEn# is pulled high to enable the sense amplifier.

The sense amp converts a relatively small voltage differential between the two bit lines at an input to the sense amp to a full swing difference at the outputs of the sense amp. The outputs comprise the bit values DT and DB at output nodes 343 and 342, respectively. Because of the voltage difference on the bit lines, one of the output bits is 0 and the other is 1. For example, a "1" bit in the memory cell may correspond to DT=1 and DB=0, and a "0" bit in the memory cell may correspond to DT=0 and DB=1.

In a pre-charge operation, transistors T12-T14 are used to pass a sense amp pre-charge voltage of Vdd to the internal nodes 344 and 329.

FIG. 4 depicts an example implementation of the control circuit 150 of FIG. 1 for generating SaEn, the sense amp enable signal of FIG. 1, where the control circuit comprises a chopper circuit to control the pulse width of SaEn. The circuit comprises a first path 400 which includes three variable delay buffers 410-412, as a simplification, followed by an inverter 413. An output of the inverter is input to an AND gate 414 along with SaClk on a second path 401 to provide SaEn as the output of the AND gate.

A drawback of the use of a chopper circuit to control the pulse width of the sense amp enable signal is the sensitivity of the inverter/buffer delay chain to process skew, voltage and temperature. The circuit can also result in pulse triangulation, as discussed below.

FIG. 5A depicts the sense amp enable signal of FIG. 1 as generated by a chopper circuit similar to that in FIG. 4 but with 20 stages, where the signal has a low voltage, and where the signal is close to (plot 500) or far from (plot 501) the control circuit 150. There is no waveform triangulation in this example. Generally, the control circuit which generates the sense amp enable signal should avoid triangulation of the signal or pulse evaporation, where the signal does not reach Vss. This goal can be challenging especially at a relatively high voltage operating point. The signal at the farthest point from the control circuit is most susceptible to these problems. This example shows that with a relatively low voltage, the signal at the farthest point has the same width (100%) as the signal at the closest point, where the width is taken at half the peak amplitude.

FIG. 5B depicts the sense amp enable signal of FIG. 1 as generated by a chopper circuit similar to that in FIG. 4 but with 20 stages, where the signal has a high voltage, and where the signal is close to (plot 510) or far from (plot 511) the control circuit 150. The plot 511 shows waveform triangulation. At a relatively high voltage, a width of the signal at the farthest point is only 70% of the width of the signal at the closest point, due to the shorter pulse duration.

FIG. 5C depicts the sense amp enable signal of FIG. 1 as generated by a chopper circuit similar to that in FIG. 4 but with 25 stages, where the signal has a low voltage, and where the signal is close to (plot 520) or far from (plot 521) the control circuit 150. There is no waveform triangulation in this example. Adding buffers to the chopper circuit can help reduce the pulse triangulation, such as depicted in FIGS. 5C and 5D. However, this increases the pulse width, especially at lower voltages, resulting in an undesirable increase in the read time.

This example shows that with a relatively low voltage, the signal at the farthest point has the same width (100%) as the signal at the closest point.

FIG. 5D depicts the sense amp enable signal of FIG. 1 as generated by a chopper circuit similar to that in FIG. 4 but with 25 stages, where the signal has a high voltage, and where the signal is close to (plot 530) or far from (plot 531) the control circuit 150. The plot 531 shows waveform triangulation but less than with plot 511 in FIG. 5B. At a relatively high voltage, a width of the signal at the farthest point is 90% the width of the signal at the closest point, due to the shorter pulse duration. As mentioned, the triangulation is decreased at higher voltages but at the expense of a greater overall pulse width.

The pulse width of the sense amp enable signal is still sub-optimal with these approaches. One modification is to reduce the number of buffer stages while adding interconnect and side gate loads to minimize voltage sensitivity. However, this topology still does not match the RC profile of a real sense amp enable signal and therefore cannot provide the advantages of the feedback techniques disclosed herein.

FIG. 6A depicts an example implementation of the SRAM device of FIG. 1, where the control circuit 150*a* comprises a set-reset latch 620 for de-asserting a sense amp enable signal in response to a feedback signal from the set of sense amplifiers, and the feedback signal is taken from a point which is after the farthest sense amp from the control circuit in accordance with various embodiments. A change in the voltage of the feedback signal is used to reset the set-reset latch to de-assert the sense amp enable signal. This provides a self-resetting topology which is less sensitive to voltage and temperature variations since intentional delay elements are not used to modulate the sense amp enable pulse width.

The control circuit 150*a* provides a timer and control logic for asserting and de-asserting the sense amp enable signal.

As in FIG. 1, SaClk is output from the inverter 140. The clock signal is provided on a path 641 to a first input node 632 of an AND gate 610 and to a first input node 627 of a first NAND gate 621 in the set-reset latch 620. The AND gate 610, at a second input node 631, receives a feedback signal SaEn_fbk from an output node 628 of the first NAND gate. Based on the inputs, the AND gate provides an output signal SaEn to an inverter 611 which in turn outputs SaEn# (# denotes an inverse) on a path 629. The path 629 in turn is connected to a first conductive path 160 which is coupled to each of the sense amps SA0-SA7.

The AND gate 610 and the inverter 611 are in a series of logic gates comprising a first input node 641, a second input node 631 and an output node which is the path 629. The first input node of the series of logic gates and the first NAND gate 621 receive a common clock signal, SaClk.

A feedback path begins at a point 160a of the conductive path 160 which is after the farthest sense amp (SA7) from the control circuit 150a. SA7 is farthest from the control circuit since a conductive path between the two is longer than a conductive path between the control circuit and any other sense amp. The feedback path includes a path 651 which feeds into a repeater 630 which increases the power of the signal and retransmits it as the feedback signal SaEnd# on the path 640. This is a version of the sense amp enable signal SaEn#. The control circuit includes a set-reset circuit 620 including first and second NAND gates 621 and 622, respectively. A NAND gate has an output of 0 if both inputs are 1, and an output of 1 if one or both inputs are 0. Each NAND gate has first and second input nodes and one output node. Each output node is fed to the input of the other NAND gate in a cross-coupled arrangement.

For example, the first NAND gate 621 has first and second input nodes 627 and 626, respectively, and an output node 628. The second NAND gate 622 has first and second input nodes 625 and 623, respectively, and an output node 624. The output node 628 carries a signal SaEn_fbk to the input node 631 of the AND gate 610. The other input node 641 of the AND gate receives SaClk. An AND gate has an output of 1 if both inputs are 1. An AND gate has an output of 0 if one or both inputs are 0. The output of the AND gate carries a signal SaEn to an inverter 611. The inverted signal SaEn# is carried on a path 629 which in turn is connected to each of the sense amps, such as at the transistor T19 in FIG. 3.

The operation of the device can be understood further with reference to FIG. 6B-6E. FIG. 6B depicts a table of signal values consistent with FIG. 6A at the time the device is in an idle state. In an idle state, before the sense amp enable signal is asserted in a clock cycle, SaClk/node 627=0, indicating a low signal such as Vss. As a result, SaEn=0 at the output of the AND gate and SaEn#=1 at the output of the inverter 611. Since the path 640 which carries SaEnd# is connected to the path 160, SaEnd#=1. Since path 160 is connected to the input node 623, the node 623=1. Similarly, the connected nodes 624 and 626=0, and the connected nodes 625, 628 and 631, and the signal SaEn_fbk=1.

FIG. 6C depicts a table of signal values following FIG. 6B, at the time SaEn# is asserted and before the feedback signal changes at the control circuit. This can be at t3 in FIG. 2, for example. At this time, SaClk/node 627 change from 0 to 1, indicating a high signal such as Vdd. As a result, SaEn changes from 0 to 1 at the output of the AND gate and SaEn# changes from 1 to 0 at the output of the inverter 611, representing the assertion of the sense amp enable signal. This low-going signal (SaEn#) is driven to all of the sense amplifiers. At this moment, the change in SaEn# has not yet propagated to the path 640, so that SaEnd# remains at 1.

Accordingly, there is no change in the state of the set-reset latch. The state may be represented by the value of SaEn_fbk.

FIG. 6D depicts a table of signal values following FIG. 6C, when SaEn# is still asserted and the feedback signal first changes at the control circuit. This can be just before t5 in FIG. 2, for example. SaClk/node 627 and SaEn remain at 1, and SaEn# remains at 0. At this moment, the change in SaEn# has propagated to the path 640, so that SaEnd# changes to 0. This changes node 623 to 0 as well. As a result, node 624/626 changes to 1, and nodes 625, 628 and 631, and the signal SaEn_fbk, change to 0.

FIG. 6E depicts a table of signal values following FIG. 6D, when SaEn# is de-asserted by the change in the feedback signal at the control circuit. This can be just after t5 in FIG. 2, for example. SaClk/node 627 remain at 1. SaEn changes to 0, so that SaEn# changes to 1, representing the de-assertion of the sense amp enable signal. SaEnd# and node 623 remain at 0, nodes 624/626 remain at 1, and nodes 625, 628 and 631, and the signal SaEn_fbk, remain at 0. SaClk should remain at 1 until after SaEn# is de-asserted to allow the feedback signal to trigger the de-assertion. If this criterion is not met, SaEn# signal may triangulate due to the early reset of the set-reset latch by the falling transition of SaClk. This is not an issue since the delay of replica column bit line tracking circuit is usually much greater than the delay of the SaEn# self-resetting loop.

SaEn is de-asserted (1->0) only after it reaches the last column input/output (I/O). As a result, there is no risk of pulse evaporation. Moreover, since the actual path is used to reset SaEn#, there is no need for an additional guard band to account for interconnect variations and side-load modeling differences. This results in an optimal pulse width for the sense amp enable signal. Also, there is no area impact with the self-resetting topology since the buffer generating SaEnd# can be placed in a transition region near the SRAM array.

Another advantage of the self-resetting topology is that the set-reset latch can be accommodated inside a local control block of multi-bank SRAM arrays. This eliminates the need to route signals such as SaEnd# which have a narrow pulse width from global control to local control.

FIG. 7 depicts example waveforms consistent with FIG. 6A including SaClk, SaEn#, SaEnc_L, SaEnd# and SaEnd_fbk. The time points t3 and t5, consistent with FIG. 2, are also depicted. As in FIG. 2, SaClk (plot 700) goes high from t3-t5. When SaClk goes high, SaEn# (plot 710) goes low, indicating the sense amp enable signal is asserted. SaEn# is delayed and has a more gradual change than SaClk due to the capacitance of the conductive path over which SaEn# travels. SaEn_L (plot 720) refers to a local sense amp enable signal which is obtained by buffering and inverting SaEn# as depicted by the buffers 810 in FIG. 8-10. SaEnd# (plot 730) is similar in shape to SaEn# but is delayed due to the propagation time of SaEn# on the conductive path 160. SaEn_fbk (plot 740) is the internal feedback signal of the control circuit. SaEn_fbk transitions from high to low, as discussed, when the feedback signal SaEnd# goes sufficiently low. Also in this example, the falling edge of SaClk just after t5 causes SaEn_fbk to transition high and prepare the circuit for the next read operation.

Figure 8:
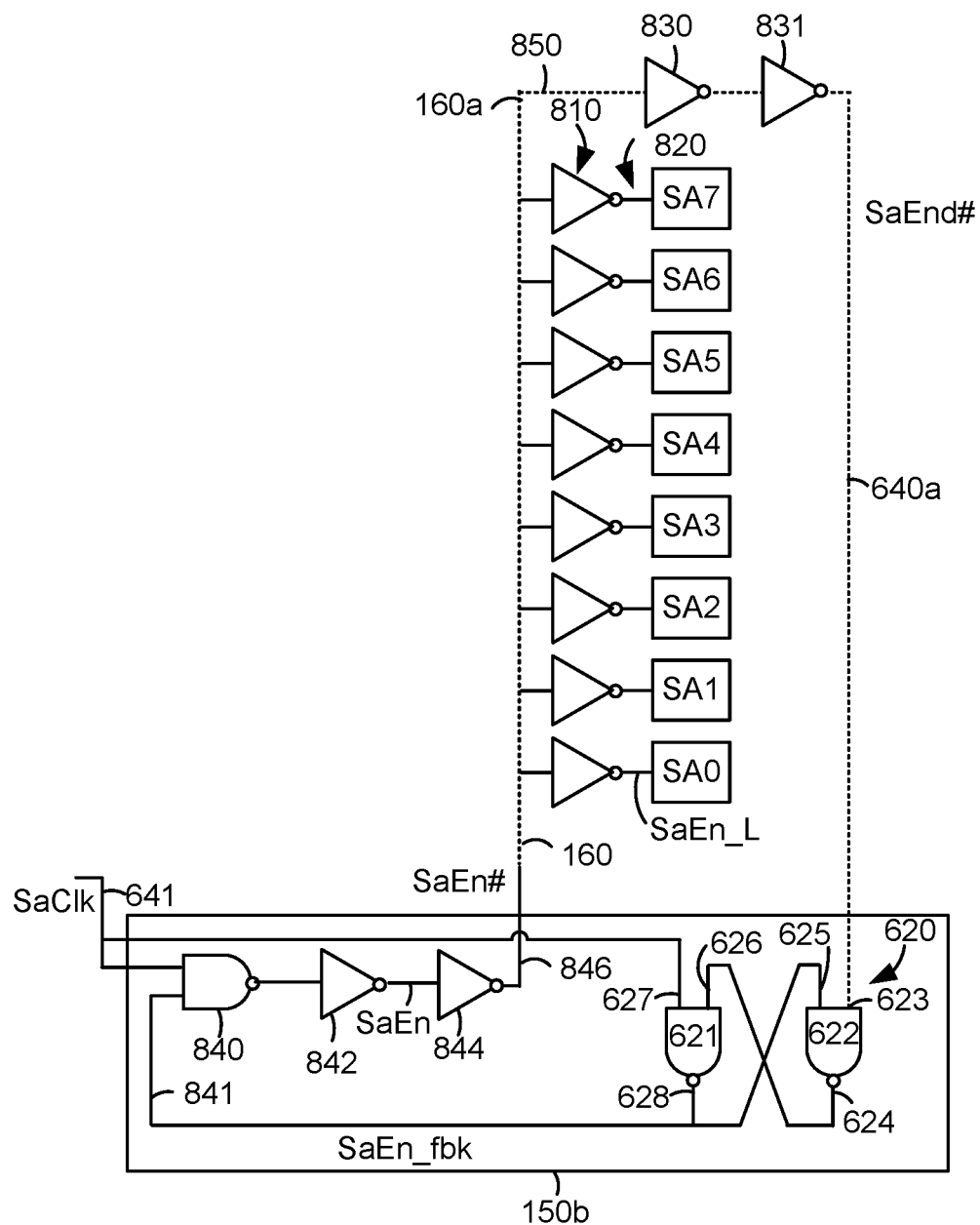
FIG. 8 depicts further details of a control circuit 150b for an SRAM device consistent with FIG. 6A in accordance with various embodiments.

FIG. 8 depicts further details of a control circuit 150b for an SRAM device consistent with FIG. 6A in accordance with various embodiments. The control circuit 150b includes a pair of buffers/inverters 842 and 844 while the conductive path 160 also includes a pair of buffers/inverters 830 and 831. Additionally, a set of local buffers/inverters 810 are provided for the sense amps, with one inverter per sense amp. The local inverters invert SaEn# and enable the sense amps to amplify the voltage differential developed on the associated bit lines. The NAND gate 840 and the inverters 842 and 844 are in a series of logic gates comprising a first input node 641, a second input node 841 and an output node 846.

Each of the inverters 810 provides a local sense amp enable signal SaEn_L on paths 820 based on SaEn#, as depicted in FIG. 7. When driving a large load, as with the driving of SaEn# on the conductive paths 160 and 640 by the control circuit 150b, it can help to buffer the signal to avoid the need to upsize the components. Even if the components were upsized, the buffers/inverters avoid a situation where the waveform is compromised and may not reach full rail.

The operation of the control circuit 150b is similar to that of the control circuit 150a of FIG. 6A. One difference is that a NAND gate 840 is used instead of an AND gate due to the additional inverter in the control circuit. In particular, the NAND gate receives SaClk at a first input node 641 and SaEn_fbk on a second input node 841. The output of the NAND gate is provided to the first inverter 842 to provide SaEn on the output node of the inverter 842. SaEn, in turn, is provided to the second inverter 844 to provide SaEn# on the output node 846 and then on the conductive path 160.

A feedback path begins at the point 160a of the conductive path 160 which is after the farthest sense amp (SA7) from the control circuit 150b. The feedback path includes a path 850 which feeds into a third inverter 830 whose output feeds into a fourth inverter 831. The feedback path also include the path 640a which returns to the control circuit 150b.

Figure 9:
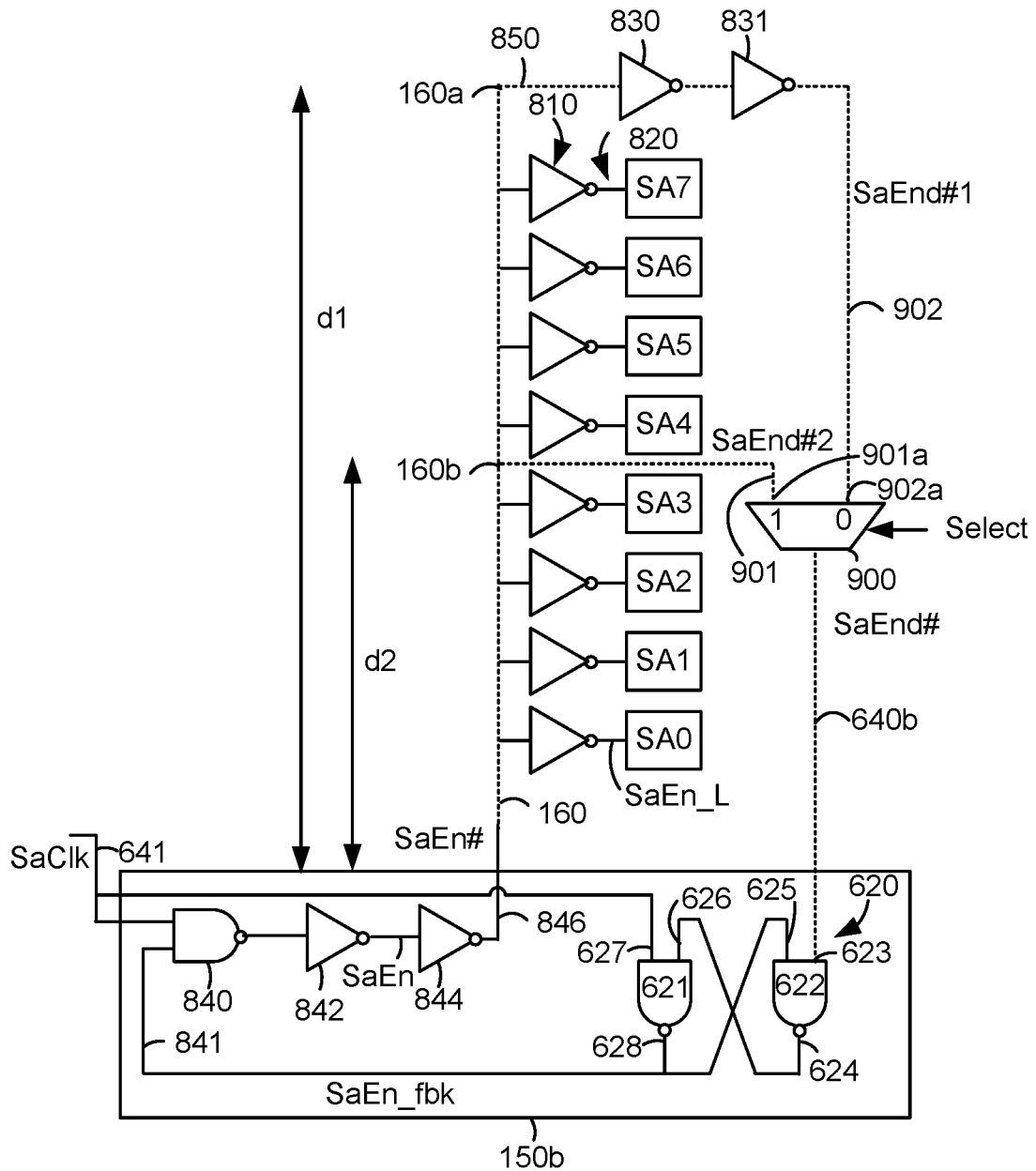
FIG. 9 depicts another example implementation of the SRAM device of FIG. 1, where a feedback signal SaEn# can be taken from a first point which is after the farthest sense amp from the control circuit or from a second point which is between the first and last sense amps, using a multiplexer 900, in accordance with various embodiments.

FIG. 9 depicts another example implementation of the SRAM device of FIG. 1, where a feedback signal SaEn# can be taken from a first point which is after the farthest sense amp from the control circuit or from a second point which is between the first and last sense amps, using a multiplexer 900, in accordance with various embodiments. The control circuit 150b is the same as in FIG. 8. However, a second feedback path can be taken at an additional point 160b of the conductive path. The points 160a and 160b can be considered first and second points, respectively. A distance d1 between the first point and the control circuit is greater than a distance d2 between the second point and the control circuit.

A conductive path 902, carrying a signal SaEnd#1, connects the point 160a with a first input node 902a of the multiplexer 900 while a conductive path 901, carrying a signal SaEnd#2, connects the point 160b with a second input node 901a of the multiplexer. The multiplexer can select one of the input nodes to pass as the feedback signal on the path 640b (an output node of the multiplexer) to the control circuit 150b.

This approach enhances the self-resetting topology of FIGS. 6A and 7 by tapping SaEn# from multiple points. The point which is selected to provide the feedback signal controls the width of the pulse amp enable signal such that a point closer to the control circuit results in a shorter pulse width. The selected tap point can be set by programmable fuses, for example, after the device has been fabricated in silicon.

In one approach, the multiplexer can be permanently set at the time of manufacture, e.g., based on tests which indicate the optimal feedback point. In another approach, a select signal can be used to select one of the feedback paths when the memory device is in use. For example, the processor 1304 of FIG. 13 may provide the select signal based on one or more factors such as temperature or operating voltage. The processor may execute instructions in a memory device to provide the select signal. The processor can obtain data indicating a temperature of the device from the temperature measurement circuit 1340 of FIG. 13. The processor can obtain data indicating an operating voltage of the device from the voltage regulator 1314 of FIG. 13.

The second point 160b is shown as being half way between the closest sense amp (SA0) to the control circuit and the farthest sense amp (SA7) from the control circuit. Other options are possible, e.g., the first point can be after one-third or two-thirds of the sense amps. Additionally, more than two feedback paths could be provided from different points on the conductive path 160. By providing different feedback paths with different lengths, the delay between the assertion of the sense amp enable signal and the receipt of the feedback signal at the control circuit can be adjusted and optimized.

Figure 10:
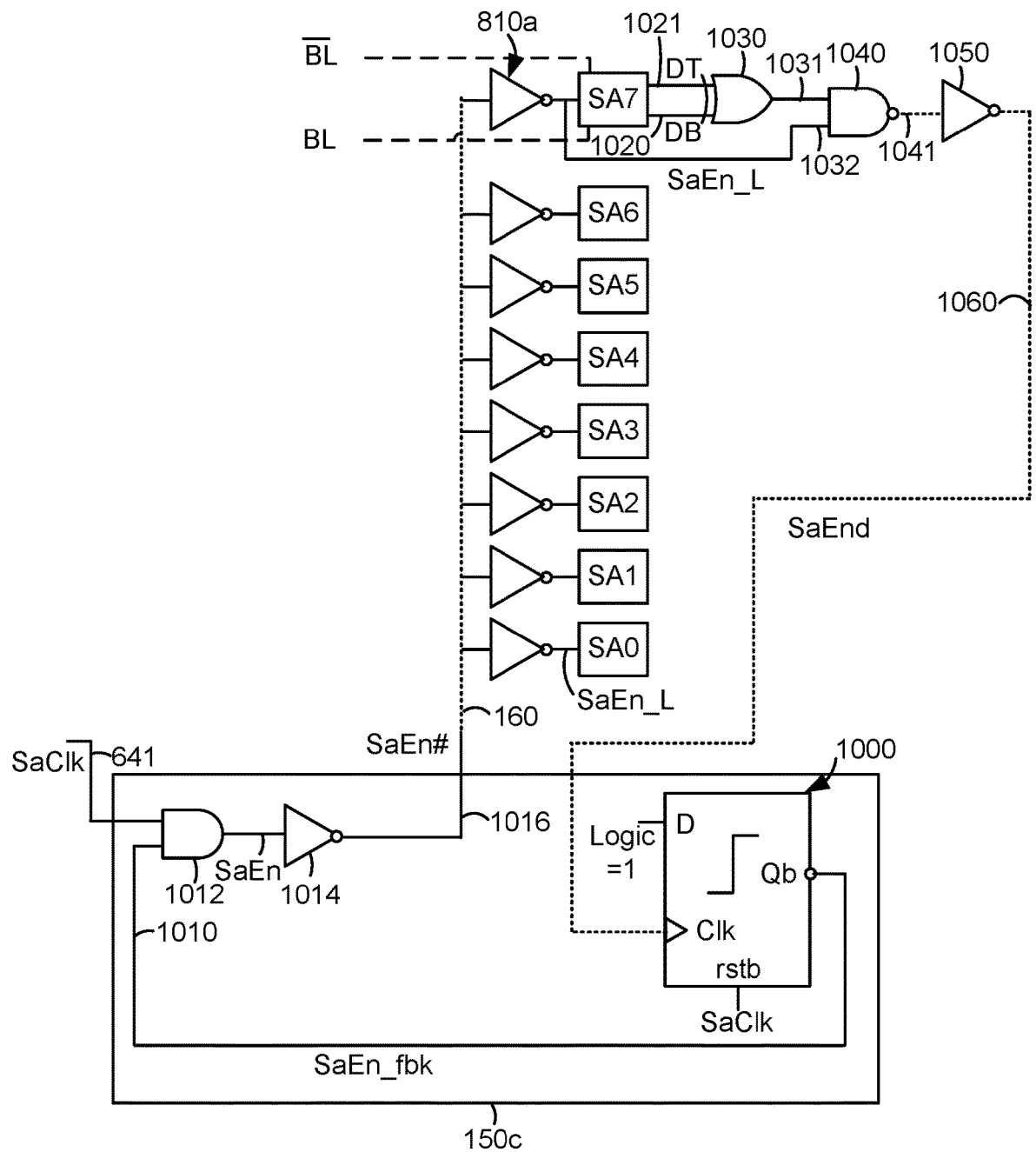
FIG. 10 depicts another example implementation of the SRAM device of FIG. 1, where a feedback signal SaEnd indicates a sense amp SA7 has completed sensing, in accordance with various embodiments.

FIG. 10 depicts another example implementation of the SRAM device of FIG. 1, where a feedback signal SaEnd indicates a sense amp SA7 has completed sensing, in accordance with various embodiments. The previous examples used a feedback signal that was a version of the sense amp enable signal carried on a conductive path 160 to each of the sense amps. A theory of the previous examples of FIGS. 6A, 8 and 9 is that, by the time the changed feedback signal is received at the control circuit and the state of the set-reset latch is changed to de-assert the sense amp enable signal, the sense amps will have completed their sensing.

However, the time used by the sense amps to complete their sensing can vary and may take longer than the time used in returning a changed feedback signal to the control circuit, such that the de-assertion of the sense amp enable signal occurs earlier than is optimal.

The approach of FIG. 10 address this issue by delaying the change in the feedback signal until a selected sense amp has completed its sensing and output corresponding read data. This approach therefore considers the sense amp evaluation time. For example, in the sense amp of FIG. 3, the complementary output bits are DT and DB, e.g., one bit is 0 and the other is 1. In this example, the selected sense amp 810a is the farthest from the control circuit. The selected sense amp is evaluated to determine when it completes sensing. With this approach, when SA7 completes its sensing, the other sense amps will have completed their sensing as well. Although, it is not necessary for the selected sense amp to be the farthest from the control circuit. In another option, more than one sense amp can be configured to be evaluated to determine when it completes sensing. A feedback signal to the control circuit can then be selected from one of the sense amps using a multiplexer such as in FIG. 9.

In this example, SA7 evaluates voltages on the bit lines BL and BL_overbar from a column of a respective selected memory cell. A set of logic gates including an exclusive-OR (XOR) gate 1030 and a NAND gate 1040 are used to determine whether SA7 has completed sensing. Recall that SaEn# is low when asserted so that SaEn_L will be high. SaEn_L should remain high for a time period which extends past the expected time for SA7 to complete sensing, so that a change in the feedback signal will be due to the sense amp completing its sensing and not due to a change in the sense amp enable signal.

When SA7 has not yet completed its sensing, its outputs DB and DT on first and second output nodes 1020 and 1021, respectively, will be the same, e.g., both 1. The XOR gate has an output of 0 if both inputs are the same, or 1 when the inputs are different. With DB and DT being the same, the XOR output node 1031 is 0. This is also an input node to the NAND gate 1040. With SaEn_L=1, the output of the NAND gate is 1 and the output of the inverter 1050 is 0.

When SA7 completes sensing, DB and DT will be different, e.g., one is 0 and the other is 1 since they reach opposite polarities. Accordingly, when SA7 completes its sensing, the output node of the XOR changes from 0 to 1. With SaEn_L=1 on the other input node 1032 of the NAND gate, its output node 1041 will change from 1 to 0. SaEn_L is a version of the enable signal SaEn#. The output of the inverter 1050 on the path 1060, which is the signal SaEnd, will change from 0 to 1.

The control circuit 150c includes an inverting flip flop 1000, also referred to as a D flip flop, which triggers the de-assertion of the sense amp enable signal based on the feedback signal SaEnd. SaEnd is provided to a clock input (Clk) of the inverting flip flop, while logic=1 is provided to the D input. The output of the flip flop at a node Qb is SaEn_fbk on a path 1010. The increase in SaEnd from 0 to 1 causes Qb and SaEn_fbk to change from 1 to 0. With SaClk high and SaEn_fbk low, the output of the AND gate 1012, SaEn, changes from 1 to 0, and the output of the inverter 1014 on the path 1016 changes from 0 to 1 to de-assert the sense amp enable signal. A signal at 0 refers to a low amplitude signal such as one at Vss and a signal at 1 refers to a high amplitude signal such as one at Vdd.

SaClk is connected to the asynchronous reset pin, rstb, of the flip flop to reset the state of the flip flop back to logic 1 after the de-assertion of the sense amp enable signal. See FIG. 11.

As an option to the control circuits 150a-150c, a CPU, microprocessor, state machine or other control circuit can be used which executes software, firmware or other instructions to perform the techniques described herein.

The techniques are also applicable to single cycle synchronous SRAM array designs in high performance x86 CPU cores.

Figure 11:
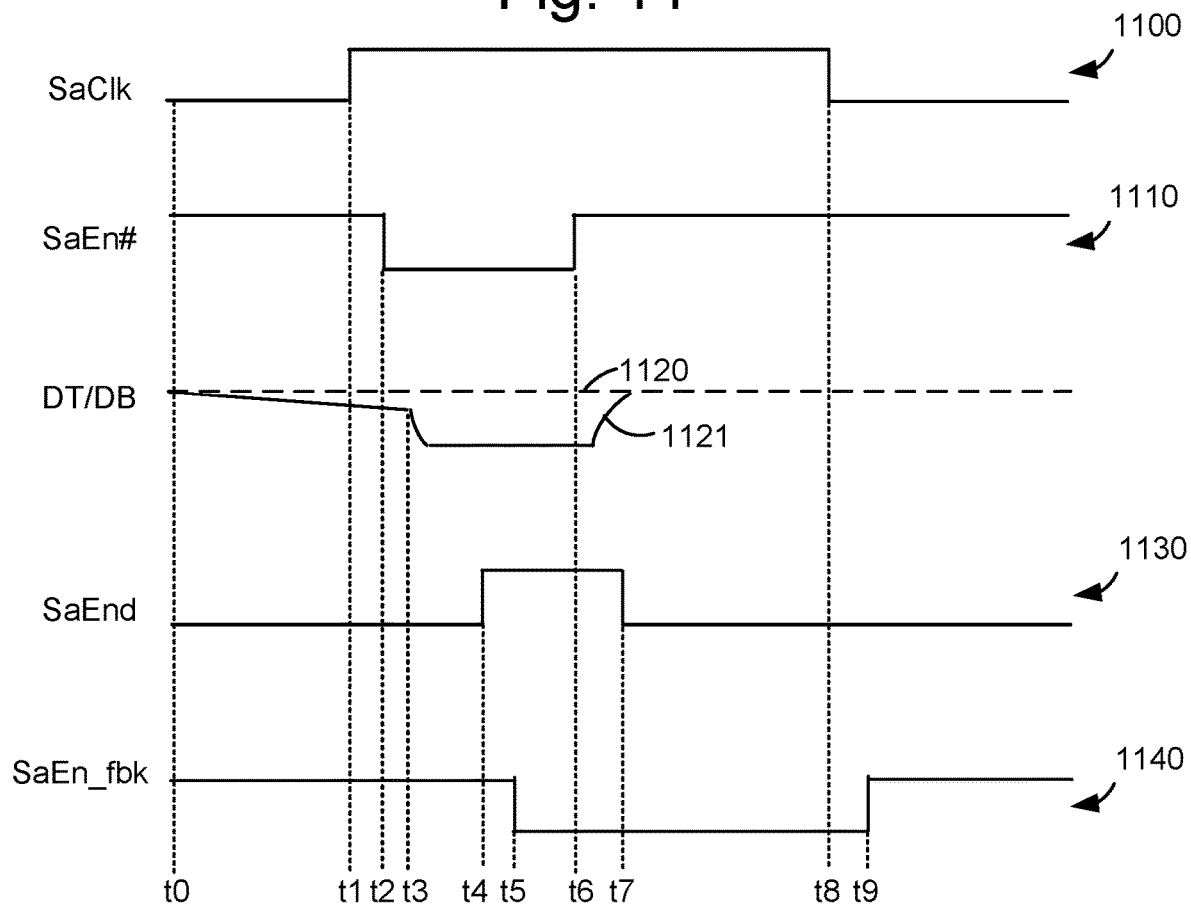
FIG. 11 depicts example waveforms consistent with FIG. 10 including SaClk, SaEn#, DT/DB, SaEnd and SaEn_fbk.

FIG. 11 depicts example waveforms consistent with FIG. 10 including SaClk, SaEn#, DT/DB, SaEnd and SaEn_fbk. Time points t0-t8 are also depicted. SaClk (plot 1100) goes high from t1-t7. The increase in SaClk triggers a change in SaEn# (plot 1110), from high to active low, at t2. Plots 1120 and 1121 depict the outputs DT/DB of the selected sense amp, e.g., SA7 in FIG. 10. The outputs are initially the same starting at t0. One of the outputs remains constant while the other output gradually decreases, until t3, when the lower output decreases to a full rail level slightly after the assertion of the sense amp enable signal SaEn#. The feedback signal SaEnd (plot 1130) goes high at t4 in response to the completion of the sensing at the selected sense amp. SaEn_fbk (plot 1140) goes low at t5, slightly after SaEnd goes high.

After the sensing is completed, DT/DB return to the same level at t7, causing SaEnd to return low. The change in SaClk at t8 also triggers a return to a high level for SaEn_fbk after a slight delay.

Figure 12:
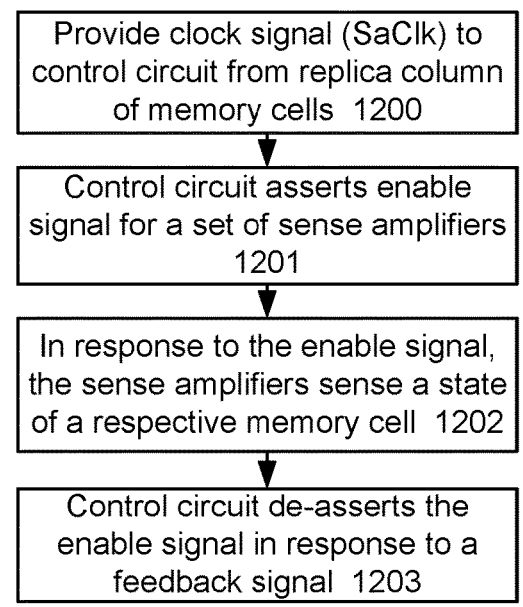
FIG. 12 depicts a method for asserting and de-asserting a sense amp enable signal in accordance with various embodiments.

FIG. 12 depicts a method for asserting and de-asserting a sense amp enable signal in accordance with various embodiments. Step 1200 includes providing a clock signal from a replica column of memory cells. At step 1201, the control circuit asserts an enable signal for a set of sense amplifiers. At step 1202, in response to the enable signal, the sense amplifiers sense a state of a respective memory cell. At step 1203, the control circuit de-asserts the enable signal in response to a feedback signal.

The method can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Figure 13:
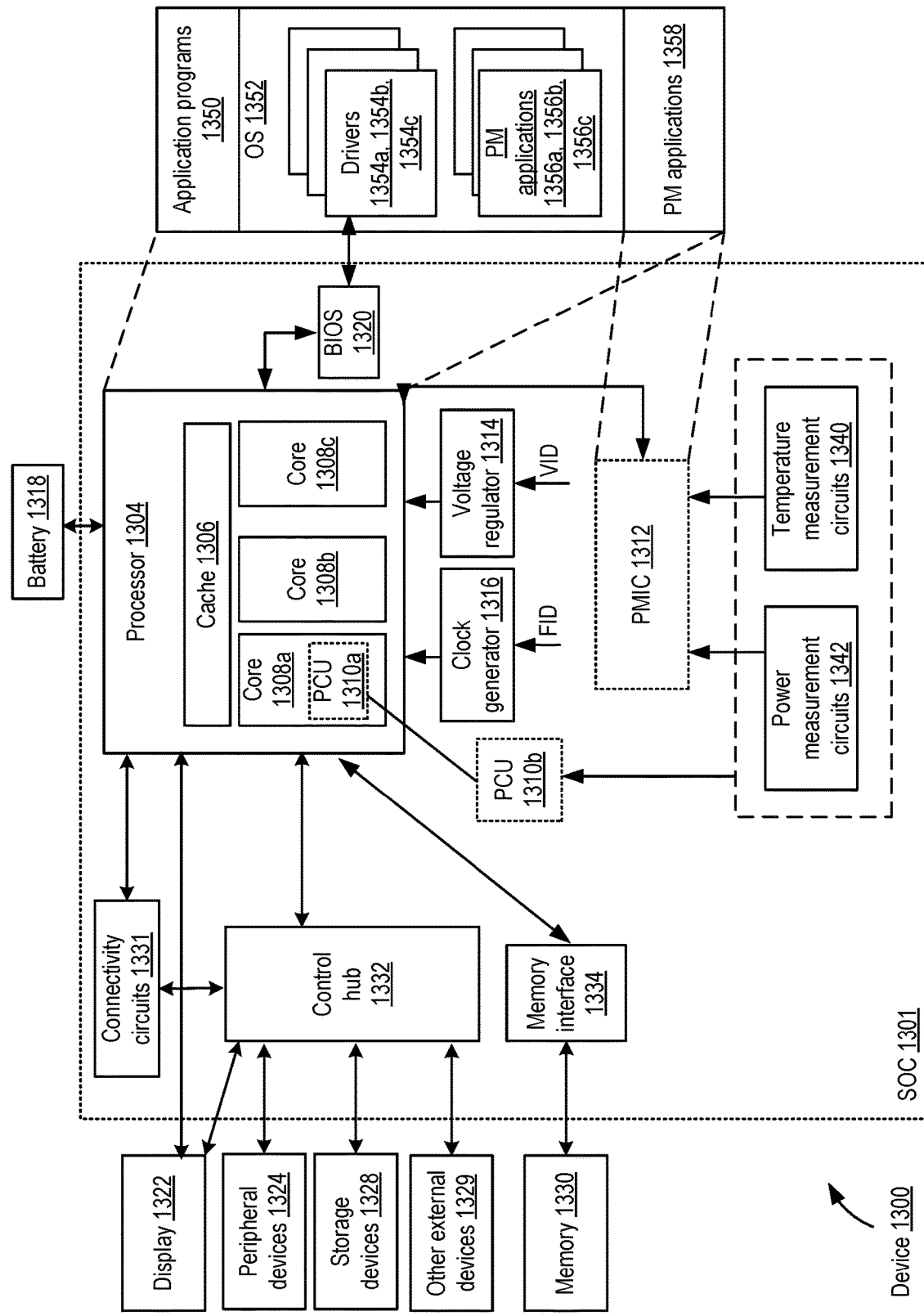
FIG. 13 illustrates a smart device or a computer system or a System-on-Chip (SoC) with apparatus and/or software in accordance with some embodiments.

FIG. 13 illustrates a smart device or a computer system or a System-on-Chip (SoC) with apparatus and/or software in accordance with some embodiments. In some embodiments, device 1300 represents a computing device such as a computing tablet, a mobile phone or smartphone, a laptop, a desktop, an Internet-of-Things (IOT) device, a server, a wearable device, a set-top box, a wireless-enabled e-reader, or the like. It will be understood that certain components are shown generally, and not all components of such a device are shown in device 1300.

A SRAM device such as discussed herein can be provided in the storage devices 1328 or the memory 1330, for example.

In an example, the device 1300 comprises a SoC (System-on-Chip) 1301. An example boundary of the SoC 1301 is illustrated using dotted lines, with some example components being illustrated to be included within the SoC.

In some embodiments, device 1300 includes a processor 1304. Processor 1304 can include one or more physical devices, such as microprocessors, application processors, microcontrollers, programmable logic devices, or processing cores. The processing operations performed by processor 1304 can include the execution of an operating platform or operating system on which applications and/or device functions are executed. The processing operations can include operations related to I/O (input/output) with a human user or with other devices, operations related to power management, operations related to connecting computing device 1300 to another device. The processing operations may also include operations related to audio I/O and/or display I/O.

In some embodiments, the processor 1304 includes multiple processing cores such as the example cores 1308a, 1308b, 1308c. The cores may be implemented on a single integrated circuit (IC) chip which may include one or more shared and/or private caches, buses or interconnections, graphics and/or memory controllers, or other components.

In some embodiments, the processor 1304 includes a cache 1306. Sections of the cache 1306 may be dedicated to individual cores or one or more sections of the cache 1306 may be shared among two or more cores. The cache 1306 may be split in different levels, e.g., level 1 (L1) cache, level 2 (L2) cache and level 3 (L3) cache.

In some embodiments, the processor 1304 may include a fetch unit to fetch instructions from any storage devices such as the memory 1330, for execution by the core 1304.

In some embodiments, the device 1300 comprises connectivity circuits 1331 such as hardware devices (e.g., wireless and/or wired connectors and communication hardware) and/or software components (e.g., drivers, protocol stacks), e.g., to enable the device 1300 to communicate with external devices. The device 1300 may be separate from the external devices, such as other computing devices, wireless access points or base stations, etc.

In some embodiments, the device 1300 comprises a control hub 1332, which represents hardware devices and/or software components related to interaction with one or more I/O devices. For example, the processor 1304 may communicate with a display 1322, peripheral devices 1324, storage devices 1328, and external devices 1329 via the control hub 1332. The control hub 1332 may be a chip set, a Platform Control Hub (PCH), or the like.

The control hub 1332 may connect additional devices to the device 1300, e.g., through which a user might interact with the system. For example, connectivity circuits 1331 may be coupled to the control hub 1332, e.g., in addition to, or instead of, being coupled directly to the processor 1304.

In some embodiments, the device 1300 comprises a memory 1330 coupled to the processor 1304 via a memory interface 1334. The memory 1330 includes memory devices for storing information.

In some embodiments, the device 1300 comprises temperature measurement circuits 1340, e.g., for measuring temperature of various components of device 1300. In an example, temperature measurement circuits 1340 may be embedded, or coupled or attached to various components, whose temperature are to be measured and monitored. For example, temperature measurement circuits 1340 may measure temperature of (or within) one or more of cores 1308a, 1308b, 1308c, voltage regulator 1314, memory 1330, a mother-board of SoC 1301, and/or any appropriate component of device 1300. As mentioned in connection with FIG. 9, the temperature may be used to select a feedback path for optimizing the duration of a sense amp enable signal.

In some embodiments, the device 1300 comprises power measurement circuits 1342, e.g., for measuring power consumed by one or more components of the device 1300.

In some embodiments, the device 1300 comprises one or more voltage regulator circuits 1314, generally referred to as voltage regulators (VRs). VR 1314 generates signals at appropriate voltage levels, which may be supplied to operate components of the device 1300.

In some embodiments, the device 1300 comprises a clock generator 1316 which generates clock signals at appropriate frequency levels for any appropriate components of the device 1300.

In some embodiments, the device 1300 comprises a battery 1318 supplying power to various components of the device 1300 such as the processor 1304.

In some embodiments, the device 1300 comprises Power Control Units (PCUs) 1310a and 1310b. In an example, some sections of a PCU may be implemented by one or more processing cores 1308, and these sections of the PCU are symbolically illustrated using a dotted box and labelled PCU 1310a. In an example, some other sections of PCU may be implemented outside the processing cores 1308, and these sections of PCU are symbolically illustrated using a dotted box and labelled as PCU 1310b. The PCU may implement various power management operations for device 1300.

In some embodiments, the device 1300 comprises a Power Management Integrated Circuit (PMIC) 1312, e.g., to implement various power management operations for the device 1300.

In an example, the device 1300 comprises the PCU and/or PMIC.

Various power management operations of device 1300 may be performed by the PCU and/or by PMIC 1312.

The clock generator 1316 can comprise a phase locked loop (PLL), frequency locked loop (FLL), or any suitable clock source. In some embodiments, each core of processor 1304 has its own clock source.

Also illustrated is an example software stack of device 1300 (although not all elements of the software stack are illustrated). The processor 1304 may execute application programs 1350, Operating System 1352, one or more Power Management (PM) specific application programs (e.g., generically referred to as PM applications 1358). PM applications 1358 may also be executed by the PCU and/or PMIC. OS 1352 may also include one or more PM applications 1356a, 1356b, 1356c. The OS 1352 may also include various drivers 1354a, 1354b, 1354c, some of which may be specific for power management purposes. In some embodiments, the device 1300 may further comprise a Basic Input/output System (BIOS) 1320. BIOS 1320 may communicate with OS 1352 via one or more of the drivers.

Some non-limiting examples of various embodiments are presented below.

Example 1 includes an apparatus, comprising: a set of sense amplifiers, each sense amplifier to connect to a respective column of memory cells of a memory array; and a control circuit to assert an enable signal for the set of sense amplifiers on a conductive path which is connected to each of the sense amplifiers, each sense amplifier to sense a memory cell of the respective column of memory cells while the enable signal is asserted, and the control circuit to de-assert the enable signal in response to a feedback signal.

Example 2 includes the apparatus of example 1, wherein: the feedback signal is from a point on the conductive path.

Example 3 includes the apparatus of example 2, wherein: the point is after a sense amplifier of the set of sense amplifiers which is farthest from the control circuit.

Example 4 includes the apparatus of example 2, wherein: the point is between a sense amplifier of the set of sense amplifiers which is farthest from the control circuit and a sense amplifier of the set of sense amplifiers which is closest to the control circuit.

Example 5 includes the apparatus of any of examples 1~4 and further comprises: a multiplexer comprising a first input node connected to a first point on the conductive path, a second input node connected to a second point on the conductive path, and an output node connected to the control circuit; wherein: a distance between the first point and the control circuit is greater than a distance between the second point and the control circuit; and the feedback signal is from the first point when the multiplexer selects the first input node and from the second point when the multiplexer selects the second input node.

Example 6 includes the apparatus of example 5, wherein: the multiplexer is to select the first input node or the second input node based on a temperature.

Example 7 includes the apparatus of example 5 or 6, wherein: the multiplexer is to select the first input node or the second input node based on an operating voltage.

Example 8 includes the apparatus of any of examples 1-7, wherein: a change in a level of the feedback signal indicates that the enable signal has been received at a sense amplifier of the set of sense amplifiers.

Example 9 includes the apparatus of any of examples 1-8, wherein: a change in a level of the feedback signal indicates that a selected sense amplifier of the set of sense amplifiers has completed a sensing operation for its respective column of memory cells.

Example 10 includes the apparatus of example 9 and further comprises: logic gates to receive first and second output signals from the selected sense amplifier and a version of the enable signal, the change in the level of the feedback signal is based on a change in an output signal of the logic gates which occurs when the first and second output signals differ and when the enable signal is asserted.

Example 11 includes the apparatus of example 10, wherein: the control circuit comprises an inverting flip flop; and the inverting flip flop comprises a clock input node which is to receive the feedback signal.

Example 12 includes the apparatus of any of examples 1-11, wherein: the control circuit comprises a set-reset latch; the set-reset latch is to change its state in response to a change in the feedback signal; and the control circuit is to de-assert the enable signal when the set-reset latch changes its state.

Example 13 includes the apparatus of any of examples 1-12, wherein: the control circuit is to assert the enable signal in response to a transition in a clock signal received from a replica column of the memory array, wherein the enable signal is de-asserted before a next transition in the clock signal.

Example 14 includes the apparatus of any of examples 1-13, wherein: a repeater in a feedback path which carries the feedback signal, the repeater is to buffer and drive the feedback signal to the control circuit.

Example 15 includes an apparatus comprising: a series of logic gates comprising a first input node, a second input node and an output node; and a set-reset latch comprising a first NAND gate cross-coupled to a second NAND gate; wherein: the first input node of the series of logic gates and the first NAND gate are to receive a common clock signal; the second input node of the series of logic gates is connected to an output node of the first NAND gate; the second NAND gate is to receive a feedback signal of a set of sense amplifiers; and the output node of the series of logic gates is connected by a conductive path to each sense amplifier of the set of sense amplifiers.

Example 16 includes the apparatus of example 15, wherein: the first NAND gate is to change the voltage of its output node in response to a change in a voltage of the feedback signal.

Example 17 includes the apparatus of example 15 or 16, wherein: the feedback signal is from a point on the conductive path, after a sense amplifier of the set of sense amplifiers which is farthest from the NAND gate.

Example 18 includes the apparatus of any of examples 15-17, wherein: the feedback signal is from a point on the conductive path which is between a sense amplifier of the set of sense amplifiers which is farthest from the NAND gate and a sense amplifier of the set of sense amplifiers which is closest to the NAND gate.

Example 19 includes an apparatus comprising: a set of sense amplifiers, each sense amplifier to connect to a respective column of memory cells of a memory array; a first conductive path connected to each of the sense amplifiers; and a feedback path connected to the first conductive path and to a control circuit, wherein the control circuit is to assert an enable signal for the set of sense amplifiers on the first conductive path until the control circuit detects a voltage change in a feedback signal on the feedback path.

Example 20 includes the apparatus of example 19 and further comprises: a multiplexer comprising a first input node connected to a first point on the first conductive path, a second input node connected to a second point on the first conductive path, and an output node connected to the control circuit, wherein the feedback path extends from the output node to the control circuit, from the first point to the first input node when the multiplexer selects the first input node, and from the second point to the second input node when the multiplexer selects the second input node.

Example 21 includes the apparatus of example 20, wherein: the multiplexer is to select the first input node or the second input node based on a temperature.

Example 22 includes the apparatus of example 20 or 21, wherein: the multiplexer is to select the first input node or the second input node based on an operating voltage.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a set of sense amplifiers, each sense amplifier to connect to a respective column of memory cells of a memory array; and
a control circuit to assert an enable signal for the set of sense amplifiers on a conductive path which is connected to each of the sense amplifiers, each sense amplifier to sense a memory cell of the respective column of memory cells while the enable signal is asserted, and the control circuit to de-assert the enable signal in response to a feedback signal, wherein a change in a level of the feedback signal indicates that the enable signal has been received at a sense amplifier of the set of sense amplifiers.

2. The apparatus of claim 1, wherein:
the feedback signal is from a point on the conductive path.

3. The apparatus of claim 2, wherein:
the point is after a sense amplifier of the set of sense amplifiers which is farthest from the control circuit.

4. The apparatus of claim 2, wherein:
the point is between a sense amplifier of the set of sense amplifiers which is farthest from the control circuit and a sense amplifier of the set of sense amplifiers which is closest to the control circuit.

5. The apparatus of claim 1, further comprising:
a multiplexer comprising a first input node connected to a first point on the conductive path, a second input node connected to a second point on the conductive path, and an output node connected to the control circuit; wherein:
a distance between the first point and the control circuit is greater than a distance between the second point and the control circuit; and
the feedback signal is from the first point when the multiplexer selects the first input node and from the second point when the multiplexer selects the second input node.

6. The apparatus of claim 5, wherein:
the multiplexer is to select the first input node or the second input node based on a temperature.

7. The apparatus of claim 5, wherein:
the multiplexer is to select the first input node or the second input node based on an operating voltage.

8. The apparatus of claim 1, wherein:
a change in a level of the feedback signal indicates that a selected sense amplifier of the set of sense amplifiers has completed a sensing operation for its respective column of memory cells.

9. The apparatus of claim 8, further comprising:
logic gates to receive first and second output signals from the selected sense amplifier and a version of the enable signal, the change in the level of the feedback signal is based on a change in an output signal of the logic gates which occurs when the first and second output signals differ and when the enable signal is asserted.

10. The apparatus of claim 9, wherein:
the control circuit comprises an inverting flip flop; and
the inverting flip flop comprises a clock input node which is to receive the feedback signal.

11. The apparatus of claim 1, wherein:
the control circuit comprises a set-reset latch;
the set-reset latch is to change its state in response to a change in the feedback signal; and
the control circuit is to de-assert the enable signal when the set-reset latch changes its state.

12. The apparatus of claim 1, wherein:
the control circuit is to assert the enable signal in response to a transition in a clock signal received from a replica column of the memory array, wherein the enable signal is de-asserted before a next transition in the clock signal.

13. The apparatus of claim 1, further comprising:
a repeater in a feedback path which carries the feedback signal, the repeater is to buffer and drive the feedback signal to the control circuit.

14. An apparatus, comprising:
a series of logic gates comprising a first input node, a second input node and an output node; and
a set-reset latch comprising a first NAND gate cross-coupled to a second NAND gate; wherein:
the first input node of the series of logic gates and the first NAND gate are to receive a common clock signal;
the second input node of the series of logic gates is connected to an output node of the first NAND gate;
the second NAND gate is to receive a feedback signal of a set of sense amplifiers; and
the output node of the series of logic gates is connected by a conductive path to each sense amplifier of the set of sense amplifiers.

15. The apparatus of claim 14, wherein:
the first NAND gate is to change the voltage of its output node in response to a change in a voltage of the feedback signal.

16. The apparatus of claim 14, wherein:
the feedback signal is from a point on the conductive path, after a sense amplifier of the set of sense amplifiers which is farthest from the NAND gate.

17. The apparatus of claim 15, wherein:
the feedback signal is from a point on the conductive path which is between a sense amplifier of the set of sense amplifiers which is farthest from the NAND gate and a sense amplifier of the set of sense amplifiers which is closest to the NAND gate.

18. An apparatus, comprising:
a set of sense amplifiers, each sense amplifier to connect to a respective column of memory cells of a memory array;
a first conductive path connected to each of the sense amplifiers; and
a feedback path connected to the first conductive path and to a control circuit, wherein the control circuit is to assert an enable signal for the set of sense amplifiers on the first conductive path until the control circuit detects a voltage change in a feedback signal on the feedback path.

19. The apparatus of claim 18, further comprising:
a multiplexer comprising a first input node connected to a first point on the first conductive path, a second input node connected to a second point on the first conductive path, and an output node connected to the control circuit, wherein the feedback path extends from the output node to the control circuit, from the first point to the first input node when the multiplexer selects the first input node, and from the second point to the second input node when the multiplexer selects the second input node.

20. The apparatus of claim 19, wherein:
the multiplexer is to select the first input node or the second input node based on a temperature.

21. The apparatus of claim 19, wherein:
the multiplexer is to select the first input node or the second input node based on an operating voltage.

* * * * *